(12) United States Patent
Yamamoto et al.

(10) Patent No.: US 12,388,414 B2
(45) Date of Patent: Aug. 12, 2025

(54) ACOUSTIC WAVE DEVICE

(71) Applicant: Murata Manufacturing Co., Ltd., Nagaokakyo (JP)

(72) Inventors: Koji Yamamoto, Nagaokakyo (JP); Katsuya Daimon, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 752 days.

(21) Appl. No.: 17/750,435

(22) Filed: May 23, 2022

(65) Prior Publication Data

US 2022/0278667 A1    Sep. 1, 2022

Related U.S. Application Data

(63) Continuation of application No. PCT/JP2020/044914, filed on Dec. 2, 2020.

(30) Foreign Application Priority Data

Dec. 9, 2019 (JP) .................. 2019-222040

(51) Int. Cl.
   *H03H 9/02*   (2006.01)
   *H03H 9/145*  (2006.01)
   *H03H 9/25*   (2006.01)

(52) U.S. Cl.
   CPC .... *H03H 9/02897* (2013.01); *H03H 9/02866* (2013.01); *H03H 9/02992* (2013.01); *H03H 9/145* (2013.01); *H03H 9/25* (2013.01)

(58) Field of Classification Search
   CPC ........... H03H 9/02897; H03H 9/02866; H03H 9/02992; H03H 9/145; H03H 9/25
   See application file for complete search history.

(56) References Cited

U.S. PATENT DOCUMENTS 6,154,105 A * 11/2000 Fujimoto ............. H03H 9/6459
                                                    333/194
6,353,371 B1 * 3/2002 Kadota ................ H03H 9/6436
                                                    333/195

(Continued)

FOREIGN PATENT DOCUMENTS

CN    105375902 A    3/2016
CN    107615657 A    1/2018

(Continued)

OTHER PUBLICATIONS

International Search Report in PCT/JP2020/044914, mailed Feb. 16, 2021, 3 pages.

(Continued)

*Primary Examiner* — Pedro J Cuevas
(74) *Attorney, Agent, or Firm* — Keating & Bennett, LLP (57) ABSTRACT

An acoustic wave device includes first and second electrode fingers on a piezoelectric layer, and third and fourth electrode fingers and a plurality of fourth electrode fingers are provided on the piezoelectric layer. A connection section includes second and third busbars. The second busbar is on the piezoelectric layer and is connected to one end of each of the second electrode fingers. The third busbar is on the piezoelectric layer and is connected to one end of each of the third electrode fingers. A stress relaxation layer is between the connection section and the piezoelectric layer. The stress relaxation layer does not extend to any of a gap between each of the first electrode fingers and the second busbar and a gap between each of the fourth electrode fingers and the third busbar in a plan view from a thickness direction of a support substrate.

18 Claims, 5 Drawing Sheets

(56) References Cited

U.S. PATENT DOCUMENTS

| | | | |
|---|---|---|---|
| 7,576,471 B1* | 8/2009 | Solal | H03H 9/1457 |
| | | | 310/313 B |
| 10,833,649 B2* | 11/2020 | Kawaguchi | H03H 9/725 |
| 11,133,790 B2* | 9/2021 | Daimon | H03H 9/02866 |
| 11,863,159 B2* | 1/2024 | Okada | H03H 9/02992 |
| 12,081,190 B2* | 9/2024 | Daimon | H03H 9/1092 |
| 12,191,839 B2* | 1/2025 | Iwamoto | H03H 9/02559 |
| 2004/0196119 A1 | 10/2004 | Shibahara et al. | |
| 2007/0296528 A1* | 12/2007 | Kando | H03H 9/02881 |
| | | | 333/195 |
| 2012/0188026 A1* | 7/2012 | Yamaji | H03H 9/6483 |
| | | | 333/133 |
| 2013/0249647 A1* | 9/2013 | Nakanishi | H03H 9/02881 |
| | | | 333/186 |
| 2013/0285768 A1* | 10/2013 | Watanabe | H10N 30/01 |
| | | | 333/193 |
| 2014/0015624 A1* | 1/2014 | Kishino | H03H 9/14547 |
| | | | 333/187 |
| 2015/0270826 A1* | 9/2015 | Burak | H03H 9/547 |
| | | | 333/187 |
| 2016/0049919 A1 | 2/2016 | Kuroyanagi et al. | |
| 2016/0261038 A1* | 9/2016 | Tanaka | H03H 9/64 |
| 2016/0380611 A1 | 12/2016 | Kai | |
| 2017/0047905 A1* | 2/2017 | Araki | H03H 9/02535 |
| 2017/0093372 A1* | 3/2017 | Yokoyama | H03H 9/6423 |
| 2017/0170808 A1* | 6/2017 | Iwaki | H03H 9/14532 |
| 2017/0250674 A1* | 8/2017 | Takamine | H03H 9/145 |
| 2018/0091116 A1 | 3/2018 | Kai | |
| 2019/0123713 A1* | 4/2019 | Daimon | H03H 9/1457 |
| 2019/0123721 A1* | 4/2019 | Takamine | H03H 9/72 |
| 2019/0131954 A1* | 5/2019 | Okada | H03H 9/02992 |
| 2019/0140613 A1* | 5/2019 | Kawaguchi | H03H 9/02866 |
| 2019/0158059 A1* | 5/2019 | Taniguchi | H03H 9/02858 |
| 2020/0052675 A1* | 2/2020 | Kanazawa | H03H 9/14552 |
| 2020/0220518 A1 | 7/2020 | Omura | |
| 2021/0111697 A1* | 4/2021 | Daimon | H03H 9/02574 |
| 2021/0273633 A1* | 9/2021 | Osada | H03H 9/542 |
| 2021/0297060 A1* | 9/2021 | Omura | H03H 9/564 |
| 2022/0368305 A1* | 11/2022 | Iwamoto | H03H 9/14541 |
| 2022/0407493 A1* | 12/2022 | Iwamoto | H03H 9/131 |
| 2023/0022219 A1* | 1/2023 | Michigami | H03H 9/145 |
| 2023/0041470 A1* | 2/2023 | Taniguchi | H03H 9/02842 |
| 2023/0198500 A1* | 6/2023 | Okada | H03H 9/02559 |
| | | | 310/365 |
| 2023/0261634 A1* | 8/2023 | Daimon | H03H 9/02574 |
| | | | 333/193 |
| 2024/0048116 A1* | 2/2024 | Daimon | H03H 9/02228 |
| 2024/0223154 A1* | 7/2024 | Oshima | H03H 9/02637 |
| 2024/0275356 A1* | 8/2024 | Okunaga | H03H 9/6483 |
| 2024/0313737 A1* | 9/2024 | Ito | H03H 9/02992 |
| 2024/0348233 A1* | 10/2024 | Noguchi | H03H 9/02992 |
| 2025/0150057 A1* | 5/2025 | Okunaga | H03H 9/02992 |

FOREIGN PATENT DOCUMENTS

| | | | | | |
|---|---|---|---|---|---|
| CN | 111149293 | A | * | 5/2020 | H03H 9/25 |
| CN | 111149294 | A | | 5/2020 | |
| CN | 111758219 | B | * | 7/2024 | H03H 9/6483 |
| CN | 111149293 | B | * | 10/2024 | H03H 9/6483 |
| CN | 112997403 | B | * | 1/2025 | H03H 9/25 |
| JP | 2004282707 | A | | 10/2004 | |
| JP | 2005229513 | A | | 8/2005 | |
| JP | 2016040882 | A | | 3/2016 | |
| JP | 2017011681 | A | | 1/2017 | |
| JP | 2017195580 | A | | 10/2017 | |
| JP | 6743981 | B2 | * | 8/2020 | H03H 9/564 |
| JP | 2020123819 | A | * | 8/2020 | H03H 9/0274 |
| JP | 2024176345 | A | * | 12/2024 | H03H 9/02574 |
| KR | 1020170134626 | A | | 12/2017 | |
| KR | 1020200036016 | A | | 4/2020 | |
| KR | 102441867 | B1 | * | 9/2022 | H03H 9/131 |
| WO | 2016208427 | A1 | | 12/2016 | |
| WO | 2019065666 | A1 | | 4/2019 | |
| WO | WO-2019065667 | A1 | * | 4/2019 | H03H 9/25 |

OTHER PUBLICATIONS

Written Opinion in PCT/JP2020/044914, mailed Feb. 16, 2021, 3 pages.

* cited by examiner

ACOUSTIC WAVE DEVICE

CROSS REFERENCE TO RELATED APPLICATIONS

This application claims the benefit of priority to Japanese Patent Application No. 2019-222040 filed on Dec. 9, 2019 and is a Continuation Application of PCT Application No. PCT/JP2020/044914 filed on Dec. 2, 2020. The entire contents of each application are hereby incorporated herein by reference.

BACKGROUND OF THE INVENTION

1. Field of the Invention

The present invention relates to acoustic wave devices, and more specifically to acoustic wave devices including piezoelectric layers.

2. Description of the Related Art

An acoustic wave filter device including a piezoelectric substrate and a plurality of acoustic wave resonators sharing one piezoelectric substrate has been known as an acoustic wave device (see, for example, see Japanese Unexamined Patent Application Publication No. 2017-195580). In an acoustic wave filter device described in Japanese Unexamined Patent Application Publication No. 2017-195580, each of a plurality of acoustic wave resonators includes a piezoelectric substrate and an interdigital transducer (IDT) electrode formed on the piezoelectric substrate and having a pair of comb-shaped electrodes facing each other. Each of the pair of comb-shaped electrodes includes a busbar electrode disposed to extend in an acoustic wave propagation direction, and a plurality of electrode fingers connected to the busbar electrode and disposed to extend in a direction orthogonal to the acoustic wave propagation direction. The acoustic wave filter device further includes connection wiring configured to connect the busbar electrode of one acoustic wave resonator and the busbar electrode of another acoustic wave resonator.

Japanese Unexamined Patent Application Publication No. 2017-195580 describes that the piezoelectric substrate may have a laminated structure in which a high acoustic velocity support substrate, a low acoustic velocity film, and a piezoelectric film (piezoelectric layer) are laminated in that order.

In a case where a piezoelectric substrate has a laminated structure as in the acoustic wave device described in Japanese Unexamined Patent Application Publication No. 2017-195580, a stress applied to the piezoelectric layer may increase due to a difference in a linear expansion coefficient among the piezoelectric layer, the IDT electrode, and the connection wiring. Accordingly, in the piezoelectric layer, there is a concern that polarization reversal occurs in a region overlapping a gap between the busbar electrode and the plurality of electrode fingers of one acoustic wave resonator and in a region overlapping a gap between the busbar electrode and the plurality of electrode fingers of another acoustic wave resonator in a plan view from a thickness direction of the high acoustic velocity support substrate (support substrate).

SUMMARY OF THE INVENTION

Preferred embodiments of the present invention provide acoustic wave devices that are each able to reduce or prevent the occurrence of polarization reversal.

An acoustic wave device according to a preferred embodiment of the present invention includes a support substrate, a piezoelectric layer, a plurality of first electrode fingers and a plurality of second electrode fingers, a plurality of third electrode fingers and a plurality of fourth electrode fingers, a first busbar, a connection section, and a fourth busbar. The piezoelectric layer is on the support substrate. The plurality of first electrode fingers and the plurality of second electrode fingers are on the piezoelectric layer. The plurality of first electrode fingers and the plurality of second electrode fingers are spaced apart from each other in a first direction intersecting a thickness direction of the support substrate. The plurality of third electrode fingers and the plurality of fourth electrode fingers are on the piezoelectric layer. The plurality of third electrode fingers and the plurality of fourth electrode fingers are spaced apart from each other in a second direction intersecting the thickness direction of the support substrate. The first busbar is on the piezoelectric layer and is connected to one end of each of the plurality of first electrode fingers. The connection section includes a second busbar and a third busbar. The second busbar is on the piezoelectric layer and is connected to one end of each of the plurality of second electrode fingers. The third busbar is on the piezoelectric layer and is connected to one end of each of the plurality of third electrode fingers. The fourth busbar is on the piezoelectric layer and is connected to one end of each of the plurality of fourth electrode fingers. The acoustic wave device further includes a stress relaxation layer. The stress relaxation layer is between the connection section and the piezoelectric layer. The second busbar faces the other end of each of the plurality of first electrode fingers. The third busbar faces the other end of each of the plurality of fourth electrode fingers. The stress relaxation layer does not extend to either of a gap between the plurality of first electrode fingers and the second busbar or a gap between the plurality of fourth electrode fingers and the third busbar in a plan view from the thickness direction of the support substrate.

The acoustic wave devices according to preferred embodiments of the present invention are able to reduce or prevent the occurrence of polarization reversal.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

FIGS. 1A, 1B, 2, 3A, 3B, 4, and 5 describing Preferred Embodiments 1 to 3 of the present invention are all schematic drawings, and ratios of sizes, thicknesses, and the like of elements in the drawings do not necessarily reflect actual dimensional ratios.

Preferred Embodiment 1

(1) Overall Configuration of Acoustic Wave Device

Figure 1A:
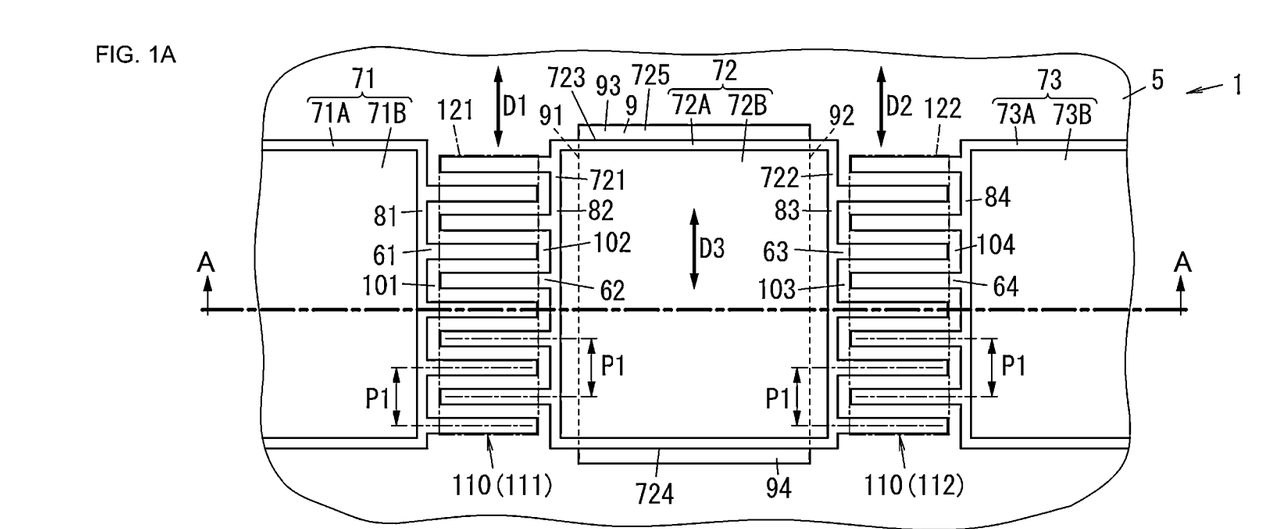
FIG. 1A is a plan view of an acoustic wave device according to Preferred Embodiment 1 of the present invention.
Figure 1B:
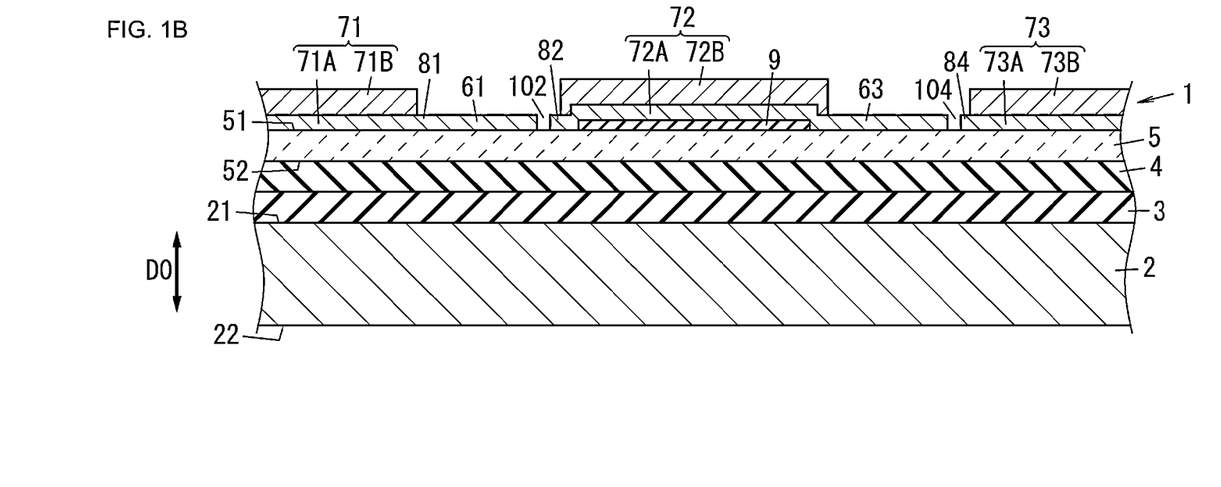
FIG. 1B is a cross-sectional view of the acoustic wave device taken along a line A-A in FIG. 1A.

Hereinafter, an acoustic wave device 1 according to Preferred Embodiment 1 of the present invention will be described with reference to FIGS. 1A, 1B, and 2.

The acoustic wave device 1 includes a support substrate 2, a piezoelectric layer 5, a plurality of first electrode fingers 61, a plurality of second electrode fingers 62, a plurality of third electrode fingers 63, a plurality of fourth electrode fingers 64, a first connection section 71, a second connection section 72 (connection section), and a third connection section 73. The plurality of first electrode fingers 61 and the plurality of second electrode fingers 62 are provided on the piezoelectric layer 5. The plurality of third electrode fingers 63 and the plurality of fourth electrode fingers 64 are provided on the piezoelectric layer 5. The first connection section 71 is provided on the piezoelectric layer 5. The first connection section 71 includes a first busbar 81 connected to one end 611 of each of the plurality of first electrode fingers 61. The second connection section 72 is provided on the piezoelectric layer 5. The second connection section 72 includes a second busbar 82 and a third busbar 83. The second busbar 82 is connected to one end 621 of each of the plurality of second electrode fingers 62 and faces the first busbar 81 and the plurality of first electrode fingers 61. The third busbar 83 is connected to one end 631 of each of the plurality of third electrode fingers 63. The third connection section 73 is provided on the piezoelectric layer 5. The third connection section 73 includes a fourth busbar 84. The fourth busbar 84 is connected to one end 641 of each of the plurality of fourth electrode fingers 64 and faces the third busbar 83 and the plurality of third electrode fingers 63. The acoustic wave device further includes a stress relaxation layer 9. The stress relaxation layer 9 is provided between the second connection section 72 and the piezoelectric layer 5.

In the acoustic wave device 1, a first interdigital transducer (IDT) electrode 111 includes the plurality of first electrode fingers 61, the plurality of second electrode fingers 62, the first busbar 81, and the second busbar 82. In the acoustic wave device 1, a second IDT electrode 112 includes the plurality of third electrode fingers 63, the plurality of fourth electrode fingers 64, the third busbar 83, and the fourth busbar 84.

The acoustic wave device 1 further includes a low acoustic velocity film 4 provided between the support substrate 2 and the piezoelectric layer 5. The acoustic wave device 1 further includes a high acoustic velocity film 3 provided between the support substrate 2 and the low acoustic velocity film 4.

(2) Elements of Acoustic Wave Device (2.1) Support Substrate

The support substrate 2 supports the piezoelectric layer 5. In the acoustic wave device 1 according to Preferred Embodiment 1, the support substrate 2 also supports the high acoustic velocity film 3 and the low acoustic velocity film 4, and supports the piezoelectric layer 5 with the high acoustic velocity film 3 and the low acoustic velocity film 4 interposed therebetween.

The support substrate 2 includes a first principal surface 21 and a second principal surface 22 opposing each other. The first principal surface 21 and the second principal surface 22 oppose each other in a thickness direction D0 of the support substrate 2. In a plan view from the thickness direction D0 of the support substrate 2, the support substrate 2 has a rectangular or substantially rectangular shape, but is not limited thereto, and may have a square or substantially rectangular shape, for example.

The thickness of the support substrate 2 is preferably in a range from about 10λ (λ: wavelength of an acoustic wave determined by an electrode finger pitch P1) μm to about 180 μm, and is about 120 μm as an example. The support substrate 2 is, for example, a silicon substrate. In this case, the plane orientation of the first principal surface 21 of the support substrate 2 is, for example, a (100) plane, but is not limited thereto, and may be, for example, a (110) plane or a (111) plane. The propagation orientation of the acoustic wave may be set without being restricted by the plane orientation of the support substrate 2.

(2.2) Piezoelectric Layer

The piezoelectric layer 5 includes a first principal surface 51 and a second principal surface 52 opposing each other. The first principal surface 51 and the second principal surface 52 oppose each other in the thickness direction D0 of the support substrate 2. The first principal surface 51 of the piezoelectric layer 5 is a positive surface in a polarization axis direction of the piezoelectric layer 5, but is not limited thereto, and may be a negative surface. The positive surface in the polarization axis direction refers to a surface in a direction in which the positive side of the polarization component in the piezoelectric layer 5 faces. The negative surface in the polarization axis direction refers to a surface in a direction in which the negative side of the polarization component in the piezoelectric layer 5 faces.

The piezoelectric layer 5 is made of, for example, a Γ° Y-cut X-propagation LiTaO$_3$ piezoelectric single crystal. When three crystal axes of the LiTaO$_3$ piezoelectric single crystal are defined as an X-axis, a Y-axis, and a Z-axis, the Γ° Y-cut X-propagation LiTaO$_3$ piezoelectric single crystal is a LiTaO$_3$ single crystal obtained by being cut along a plane normal to an axis rotated by Γ° from the Y-axis in a Z-axis direction about the X-axis, and is a single crystal through which a surface acoustic wave propagates in the X-axis direction. The cut-angle of the piezoelectric layer 5 is, when the cut-angle is taken as Γ[°] and the Euler angles of the piezoelectric layer 5 are taken as (φ, θ, Ψ), represented by an equation of Γ=θ+90°. Note that "Γ" and "Γ±180×n" are synonymous with each other (crystallographically equivalent). In this case, n is a natural number. The piezoelectric layer 5 is not limited to the Γ° Y-cut X-propagation LiTaO$_3$ piezoelectric single crystal, and may be, for example, Γ° Y-cut X-propagation LiTaO$_3$ piezoelectric ceramics.

The thickness of the piezoelectric layer 5 is, for example, smaller than or equal to about 3.5λ, where λ is a wavelength of the acoustic wave determined by the electrode finger pitch (electrode finger period) P1 of the first IDT electrode 111 and second IDT electrode 112. The electrode finger pitch P1 will be described later in the section of "(2.3) IDT Electrode". The acoustic wave device 1 has a high Q value when the thickness of the piezoelectric layer 5 is equal to or less than about 3.5λ. The acoustic wave device 1 may reduce a temperature coefficient of frequency (TCF) by setting the thickness of the piezoelectric layer 5 to be, for example, about 2.5λ or less. Furthermore, in the acoustic wave device 1, setting the thickness of the piezoelectric layer 5 to be equal to or less than, for example, about 1.5λ makes it easy to adjust the acoustic velocity of the acoustic wave. The thickness of the piezoelectric layer 5 is not limited to about 3.5λ or less, and may be, for example, larger than about 3.5λ. In the acoustic wave device 1 according to Preferred Embodiment 1, the wavelength of the acoustic wave is about 2.0 μm, for example.

In the acoustic wave device 1, when the thickness of the piezoelectric layer 5 is about 3.5λ or less, the Q value is raised as described above, but a high-order mode is generated. In the acoustic wave device 1, the low acoustic velocity film 4 and high acoustic velocity film 3 described above are provided so as to reduce the high-order mode even when the thickness of the piezoelectric layer 5 is about 3.5λ or less.

In the acoustic wave device 1, as the mode of the acoustic wave propagating through the piezoelectric layer 5, there exists a longitudinal wave, an SH wave or an SV wave, or a composite mode of these waves. In the acoustic wave device 1, a mode including an SH wave as a main component is used as a main mode. The high-order mode refers to a spurious mode generated on a higher frequency side relative to the main mode of the acoustic wave propagating through the piezoelectric layer 5. Whether the mode of the acoustic wave propagating through the piezoelectric layer 5 is "a main mode mainly including an SH wave" may be confirmed, for example, by analyzing the displacement distribution and analyzing the distortion by the finite element method using parameters such as parameters of the piezoelectric layer 5 (material, Euler angles, thickness, and the like), parameters of the first IDT electrode 111 and second IDT electrode 112 (material, thickness, the electrode finger pitch P1, and the like), and parameters of the low acoustic velocity film 4 (material, thickness, and the like). The Euler angles of the piezoelectric layer 5 may be obtained by analysis.

The material of the piezoelectric layer 5 is not limited to lithium tantalate ($LiTaO_3$), and may be, for example, lithium niobate ($LiNbO_3$), zinc oxide (ZnO), aluminum nitride (AlN), or lead zirconate titanate (PZT). When the piezoelectric layer 5 is made of, for example, a Y-cut X-propagation $LiNbO_3$ piezoelectric single crystal or piezoelectric ceramics, the acoustic wave device 1 may use, as a main mode, a mode including an SH wave as a main component. The single crystal material and the cut-angles of the piezoelectric layer 5 may be appropriately determined in accordance with, for example, required specifications (filter characteristics such as bandpass characteristics, attenuation characteristics, temperature characteristics, and band width) of a filter included in the acoustic wave device 1.

(2.3) IDT Electrode

The acoustic wave device 1 includes a plurality of IDT electrodes 110. The plurality of IDT electrodes 110 include the first IDT electrode 111 and the second IDT electrode 112 described above. The plurality of IDT electrodes 110 are provided on the piezoelectric layer 5. More specifically, the plurality of IDT electrodes 110 are provided on the first principal surface 51 on the opposite side to the second principal surface 52 on the support substrate 2 side of the piezoelectric layer 5.

The first IDT electrode 111 includes the first busbar 81, the second busbar 82, the plurality of first electrode fingers 61, and the plurality of second electrode fingers 62. The second busbar 82 faces the first busbar 81.

The plurality of first electrode fingers 61 are connected to the first busbar 81 and extends toward the second busbar 82 side. The plurality of first electrode fingers 61 are provided integrally with the first busbar 81 and are separated from the second busbar 82. In a plan view from the thickness direction D0 of the support substrate 2, there is a gap 102 between each of the plurality of first electrode fingers 61 and the second busbar 82.

The plurality of second electrode fingers 62 are connected to the second busbar 82 and extend toward the first busbar 81 side. The plurality of second electrode fingers 62 are provided integrally with the second busbar 82 and are separated from the first busbar 81. In the plan view from the thickness direction D0 of the support substrate 2, there is a gap 101 between each of the plurality of second electrode fingers 62 and the first busbar 81.

The first IDT electrode 111 is, for example, a normal IDT electrode. Hereinafter, the first IDT electrode 111 will be described in more detail.

The first busbar 81 and the second busbar 82 of the first IDT electrode 111 have an elongated shape whose longitudinal direction extends in a first direction D1 orthogonal or substantially orthogonal to the thickness direction D0 of the support substrate 2. To rephrase, the first busbar 81 and the second busbar 82 of the first IDT electrode 111 have an elongated shape whose longitudinal direction takes the first direction D1, which is an acoustic wave propagation direction. In the first IDT electrode 111, the first busbar 81 and the second busbar 82 face each other in a direction orthogonal or substantially orthogonal to both the thickness direction D0 of the support substrate 2 and the first direction D1 (hereinafter also referred to as a first defined direction).

The plurality of first electrode fingers 61 are connected to the first busbar 81 and extend toward the second busbar 82. The plurality of first electrode fingers 61 extend from the first busbar 81 along the first defined direction. Tips (the other ends 612) of the plurality of first electrode fingers 61 are separated from the second busbar 82. The above-described gap 102 is present between each tip of the plurality of first electrode fingers 61 and the second busbar 82. For example, each of the plurality of first electrode fingers 61 has the same or substantially the same length and width.

The plurality of second electrode fingers 62 are connected to the second busbar 82 and extend toward the first busbar 81. The plurality of second electrode fingers 62 extend from the second busbar 82 along the first defined direction. Tips (the other ends 622) of the plurality of second electrode fingers 62 are separated from the first busbar 81. The above-described gap 101 is present between each tip of the plurality of second electrode fingers 62 and the first busbar 81. For example, each of the plurality of second electrode fingers 62 has the same or substantially the same length and width. In the example shown in FIG. 1A, the length of the plurality of second electrode fingers is the same or substantially the same as the length of the plurality of first electrode fingers 61. Further, in the example shown in FIG. 1A, the width of the plurality of second electrode fingers 62 is the same or substantially the same as the width of the plurality of first electrode fingers 61.

In the first IDT electrode 111, the plurality of first electrode fingers 61 and the plurality of second electrode fingers are spaced apart from each other in the first direction D1 intersecting the thickness direction D0 of the support substrate 2. In this case, the plurality of first electrode fingers 61 and the plurality of second electrode fingers 62 are alternately arranged one by one and spaced apart from each other in the first direction D1, but are not limited thereto. The first electrode finger 61 and the second electrode finger 62 adjacent to each other are separated from each other. The first busbar 81 is a conductor portion that causes the plurality of first electrode fingers 61 to have the same potential. The second busbar 82 is a conductor portion that causes the plurality of second electrode fingers 62 to have the same potential (equipotential).

The first IDT electrode 111 includes an overlap region 121 defined by the plurality of first electrode fingers 61 and the plurality of second electrode fingers 62. The overlap region 121 is between an envelope of the tips of the plurality of first electrode fingers 61 and an envelope of the tips of the plurality of second electrode fingers 62. The first IDT electrode 111 excites an acoustic wave in the overlap region 121.

The electrode finger pitch P1 of the first IDT electrode 111 is defined by a distance between center lines of two adjacent first electrode fingers 61 among the plurality of first electrode fingers 61 or a distance between center lines of two adjacent second electrode fingers 62 among the plurality of second electrode fingers 62. The distance between the center lines of two adjacent second electrode fingers 62 is the same or substantially the same as the distance between the center lines of two adjacent first electrode fingers 61.

In the first IDT electrode 111 of the acoustic wave device 1 according to Preferred Embodiment 1, the number of pairs of the first electrode finger 61 and the second electrode finger 62 is, for example, 100. That is, the first IDT electrode 111 includes, for example, 100 first electrode fingers 61 and 100 second electrode fingers 62.

The second IDT electrode 112 includes the third busbar 83, the fourth busbar 84, the plurality of third electrode fingers 63, and the plurality of fourth electrode fingers 64. The fourth busbar 84 faces the third busbar 83.

The plurality of third electrode fingers 63 are connected to the third busbar 83 and extends toward the fourth busbar 84 side. The plurality of third electrode fingers 63 are provided integrally with the third busbar 83 and are separated from the fourth busbar 84. In the plan view from the thickness direction D0 of the support substrate 2, there is a gap 104 between each of the plurality of third electrode fingers 63 and the fourth busbar 84.

The plurality of fourth electrode fingers 64 are connected to the fourth busbar 84 and extend toward the third busbar 83 side. The plurality of fourth electrode fingers 64 is provided integrally with the fourth busbar 84 and are separated from the third busbar 83. In the plan view from the thickness direction D0 of the support substrate 2, there is a gap 103 between each of the plurality of fourth electrode fingers 64 and the third busbar 83.

The second IDT electrode 112 is, for example, a normal IDT electrode. Hereinafter, the second IDT electrode 112 will be described in more detail.

The third busbar 83 and the fourth busbar 84 of the second IDT electrode 112 have an elongated shape whose longitudinal direction takes a second direction D2 orthogonal or substantially orthogonal to the thickness direction D0 of the support substrate 2. In other words, the third busbar 83 and the fourth busbar 84 of the second IDT electrode 112 have an elongated shape whose longitudinal direction extending in the second direction D2, which is an acoustic wave propagation direction. In the second IDT electrode 112, the third busbar 83 and the fourth busbar 84 face each other in a direction orthogonal or substantially orthogonal to both the thickness direction D0 of the support substrate 2 and the second direction D2 (hereinafter also referred to as a second defined direction). In the acoustic wave device 1 according to Preferred Embodiment 1, the second direction D2 is parallel or substantially parallel to the first direction D1. Accordingly, the second defined direction is parallel or substantially parallel to the first defined direction.

The plurality of third electrode fingers 63 are connected to the third busbar 83 and extend toward the fourth busbar 84. The plurality of third electrode fingers 63 extend from the third busbar 83 along the second defined direction. Tips (the other ends 632) of the plurality of third electrode fingers 63 are separated from the fourth busbar 84. The above-described gap 104 is present between each tip of the plurality of third electrode fingers 63 and the fourth busbar 84. For example, each of the plurality of third electrode fingers 63 has the same or substantially the same length and width.

The plurality of fourth electrode fingers 64 are connected to the fourth busbar 84 and extend toward the third busbar 83. The plurality of fourth electrode fingers 64 extend from the fourth busbar 84 along the second defined direction. Tips (the other ends 642) of the plurality of fourth electrode fingers 64 are separated from the third busbar 83. The above-described gap 103 is present between each tip of the plurality of fourth electrode fingers 64 and the third busbar 83. For example, each of the plurality of fourth electrode fingers 64 has the same or substantially the same length and width. In the example of FIG. 1A, the length of the plurality of fourth electrode fingers 64 is the same or substantially the same as the length of the plurality of third electrode fingers 63. Further, in the example of FIG. 1A, the width of the plurality of fourth electrode fingers 64 is the same or substantially the same as the width of the plurality of third electrode fingers 63.

In the second IDT electrode 112, the plurality of third electrode fingers 63 and the plurality of fourth electrode fingers 64 are spaced apart from each other in the second direction D2 intersecting the thickness direction D0 of the support substrate 2. In this case, the plurality of third electrode fingers 63 and the plurality of fourth electrode fingers 64 are alternately arranged one by one and spaced apart from each other in the second direction D2, but are not limited thereto. The third electrode finger 63 and the fourth electrode finger 64 adjacent to each other are separated from each other. The third busbar 83 is a conductor portion that causes the plurality of third electrode fingers 63 to have the same potential. The fourth busbar 84 is a conductor portion that causes the plurality of fourth electrode fingers 64 to have the same potential (equipotential).

The second IDT electrode 112 includes an overlap region 122 defined by the plurality of third electrode fingers 63 and the plurality of fourth electrode fingers 64. The overlap region 122 is between an envelope of the tips of the plurality of third electrode fingers 63 and an envelope of the tips of the plurality of fourth electrode fingers 64. The second IDT electrode 112 excites an acoustic wave in the overlap region 122.

The electrode finger pitch P1 of the second IDT electrode 112 is defined by a distance between center lines of two adjacent third electrode fingers 63 among the plurality of third electrode fingers 63 or a distance between center lines of two adjacent fourth electrode fingers 64 among the plurality of fourth electrode fingers 64. The distance between the center lines of two adjacent fourth electrode fingers 64 is the same or substantially the same as the distance between the center lines of two adjacent third electrode fingers 63.

In the second IDT electrode 112 of the acoustic wave device 1 according to Preferred Embodiment 1, the number of pairs of the third electrode finger 63 and the fourth electrode finger 64 is, for example, 100. That is, the second IDT electrode 112 includes, for example, 100 third electrode fingers 63 and 100 fourth electrode fingers 64.

The plurality of IDT electrodes 110 has conductivity. The material of the plurality of IDT electrodes 110 is, for example, aluminum (Al), copper (Cu), platinum (Pt), gold (Au), silver (Ag), titanium (Ti), nickel (Ni), chromium (Cr), molybdenum (Mo), tungsten (W), tantalum (Ta), magnesium (Mg), iron (Fe), or an alloy mainly including any one of these metals. The plurality of IDT electrodes 110 may have a structure in which a plurality of metal films made of these metals or alloys are laminated. The plurality of IDT electrodes 110 include a laminated film made of, for example, a first metal film made of a Ti film provided on the piezoelectric layer 5 and a second metal film made of an Al film provided on the first metal film. The first metal film defines and functions as a close contact film. The material of the first metal film is Ti, but is not limited thereto, and may be, for example, Cr or NiCr. The material of the second metal film is Al, but is not limited thereto, and may include Al and Cu, for example. The thickness of the first metal film is smaller than the thickness of the second metal film.

(2.4) First Connection Section

The first connection section 71 has conductivity. The first connection section 71 is provided on the piezoelectric layer 5. The first connection section 71 is provided directly on the first principal surface 51 of the piezoelectric layer 5.

The first connection section 71 includes the first busbar 81. The first busbar 81 is connected to the plurality of first electrode fingers 61. Accordingly, the first connection section 71 is connected to the plurality of first electrode fingers 61 and includes a portion of the first IDT electrode 111.

The first connection section 71 is integrally provided with the plurality of first electrode fingers 61. The first connection section 71 extends from the plurality of first electrode fingers 61 to the side opposite to the second busbar 82 side.

The first connection section 71 includes a first layer 71A and a second layer 71B. The first layer 71A is integrally provided with the plurality of first electrode fingers 61. The second layer 71B is provided on the opposite side of the first layer 71A to the piezoelectric layer 5. The first layer 71A is made of the same material and has the same or substantially the same thickness as the plurality of first electrode fingers 61, and is provided integrally with the plurality of first electrode fingers 61.

The material of the first layer 71A is, for example, Al, Cu, Pt, Au, Ag, Ti, Ni, Cr, Mo, W, Ta, Mg, Fe, or an alloy mainly including any of these metals. The first layer 71A may have a structure in which a plurality of metal films made of these metals or alloys is laminated. The first layer 71A includes a laminated film made of, for example, a first metal film made of a Ti film provided on the piezoelectric layer 5 and a second metal film made of an Al film provided on the first metal film. The first metal film defines and functions as a close contact film. The material of the first metal film is Ti, but is not limited thereto, and may be, for example, Cr or NiCr. The material of the second metal film is Al, but is not limited thereto, and may include Al and Cu, for example.

The material of the second layer 71B is, for example, Al, but is not limited thereto, and may be, for example, Cu, may include Al and Cu, or may include Al, Cu, Ti, and Pt. In a case where the second layer 71B includes, for example, Al, Cu, Ti, and Pt, the second layer 71B may be a laminated film in which, for example, a Ti film, an AlCu film, a Ti film, a Pt film, and a Ti film are provided in that order from the first layer 71A side. The second layer 71B is thicker than the first layer 71A.

(2.5) Second Connection Section

The second connection section 72 has conductivity. The second connection section 72 is provided on the piezoelectric layer 5. A portion of the second connection section 72 is directly provided on the first principal surface 51 of the piezoelectric layer 5, and the remaining portion thereof is indirectly provided on the first principal surface 51 of the piezoelectric layer 5 with the stress relaxation layer 9 interposed therebetween.

The second connection section 72 includes the second busbar 82 and the third busbar 83. The second busbar 82 is connected to the plurality of second electrode fingers 62, and faces the first busbar 81 and the plurality of first electrode fingers 61. The third busbar 83 is connected to the plurality of third electrode fingers 63. Accordingly, the second connection section 72 is connected to the plurality of second electrode fingers 62 and the plurality of third electrode fingers 63, and includes a portion of the first IDT electrode 111 and a portion of the second IDT electrode 112. The second connection section 72 includes a first connection end portion 721 including the second busbar 82 and a second connection end portion 722 including the third busbar 83. In the second connection section 72, a width H1 (see FIG. 2) of the first connection end portion 721 in the first direction D1 is longer than a first length L1 (see FIG. 2), which is a length in the first direction D1 of the overlap region 121 of the plurality of first electrode fingers 61 and the plurality of second electrode fingers 62. From the viewpoint of lowering the resistance of the second connection section 72, the width H1 is preferably equal to or greater than the first length L1. In the second connection section 72, a width H2 of the second connection end portion 722 in the second direction D2 is longer than a second length L2 (see FIG. 2), which is a length in the second direction D2 of the overlap region 122 of the plurality of third electrode fingers 63 and the plurality of fourth electrode fingers 64. From the viewpoint of lowering the resistance of the second connection section 72, the width H2 is preferably equal to or greater than the second length L2. In the second connection section 72, a width H5 (see FIG. 2) in a portion 725 between the first connection end portion 721 and the second connection end portion 722 may be smaller than the first length L1 and the second length L2, but is preferably not smaller than any of the first length L1 and the second length L2 from the viewpoint of lowering the resistance of the second connection section 72.

The second connection section 72 is integrally provided with the plurality of second electrode fingers 62 and the plurality of third electrode fingers 63. The second connection section 72 extends toward the opposite side relative to the first busbar 81 side when viewed from the plurality of second electrode fingers 62. The second connection section 72 extends toward the opposite side relative to the fourth busbar 84 side when viewed from the plurality of third electrode fingers 63.

The second connection section 72 includes a first layer (lower layer) 72A and a second layer (upper layer) 72B. The first layer 72A is made of the same material and has the same or substantially the same thickness as the plurality of second electrode fingers 62 and the plurality of third electrode fingers 63, and is provided integrally with the plurality of second electrode fingers 62 and the plurality of third electrode fingers 63. The second layer 72B is provided on the opposite side of the first layer 72A to the piezoelectric layer 5. The second layer 72B is made of the same material and has the same or substantially the same thickness as the second layer 71B of the first connection section 71. In the acoustic wave device 1 according to Preferred Embodiment 1, the plurality of second electrode fingers 62 and the plurality of third electrode fingers 63 are electrically connected to each other only via the second connection section 72. The second connection section 72 includes no pad electrode.

The material of the first layer 72A is, for example, Al, Cu, Pt, Au, Ag, Ti, Ni, Cr, Mo, W, Ta, Mg, Fe, or an alloy mainly including any of these metals. The first layer 71A may have a structure in which a plurality of metal films made of these metals or alloys is laminated. The first layer 72A includes a laminated film provided of, for example, a first metal film made of a Ti film provided on the piezoelectric layer 5 and a second metal film made of an Al film provided on the first metal film. The first metal film defines and functions as a close contact film. The material of the first metal film is Ti, but is not limited thereto, and may be, for example, Cr or NiCr. The material of the second metal film is Al, but is not limited thereto, and may include Al and Cu, for example.

The material of the second layer 72B is, for example, Al, but is not limited thereto, and may be Cu, may include Al and Cu, or may include Al, Cu, Ti, and Pt, for example. In a case where the second layer 72B includes, for example, Al, Cu, Ti, and Pt, the second layer 72B may be a laminated film in which a Ti film, an AlCu film, a Ti film, a Pt film, and a Ti film are arranged in that order from the first layer 72A side. The second layer 72B is thicker than the first layer 72A.

It is sufficient for the second connection section 72 to include, of the first layer 72A and the second layer 72B, at least the first layer 72A. From the viewpoint of lowering the resistance of the second connection section 72, it is preferable for the second connection section 72 to include both the first layer 72A and the second layer 72B. In a case where the second connection section 72 includes both the first layer 72A and the second layer 72B, it is preferable that both the first layer 72A and the second layer 72B have a length equal to or longer than the first length L1 and the second length L2 in a third direction D3.

(2.6) Third Connection Section

The third connection section 73 has conductivity. The third connection section 73 is provided on the piezoelectric layer 5. The third connection section 73 is provided directly on the first principal surface 51 of the piezoelectric layer 5.

The third connection section 73 includes the fourth busbar 84. The fourth busbar 84 is connected to the plurality of fourth electrode fingers 64. Accordingly, the third connection section 73 is connected to the plurality of fourth electrode fingers 64, and includes a portion of the second IDT electrode 112.

The third connection section 73 is integrally provided with the plurality of fourth electrode fingers 64. The third connection section 73 extends from the plurality of fourth electrode fingers 64 to the side opposite to the third busbar 83 side.

The third connection section 73 includes a first layer 73A and a second layer 73B. The first layer 73A is integrally provided with the plurality of fourth electrode fingers 64. The second layer 73B is provided on the opposite side of the first layer 73A to the piezoelectric layer 5. The first layer 73A is made of the same material and has the same or substantially the same thickness as the plurality of fourth electrode fingers 64, and is provided integrally with the plurality of fourth electrode fingers 64.

The material of the first layer 73A is, for example, Al, Cu, Pt, Au, Ag, Ti, Ni, Cr, Mo, W, Ta, Mg, Fe, or an alloy mainly including any of these metals. The first layer 73A may have a structure including a plurality of metal films made of these metals or alloys is laminated. The first layer 73A includes a laminated film including, for example, a first metal film made of a Ti film provided on the piezoelectric layer 5 and a second metal film made of an Al film provided on the first metal film. The first metal film defines and functions as a close contact film. The material of the first metal film is, for example, Ti, but is not limited thereto, and may be, for example, Cr or NiCr. The material of the second metal film is, for example, Al, but is not limited thereto, and may include Al and Cu, for example.

The material of the second layer 73B is, for example, Al, but is not limited thereto, and may be Cu, may include Al and Cu, or may include Al, Cu, Ti, and Pt, for example. In a case where the second layer 73B includes, for example, Al, Cu, Ti, and Pt, the second layer 73B may be a laminated film in which a Ti film, an AlCu film, a Ti film, a Pt film, and a Ti film are arranged in that order from the first layer 73A side. The second layer 73B is thicker than the first layer 73A.

(2.7) Stress Relaxation Layer

The stress relaxation layer 9 is provided between the second connection section 72 and the piezoelectric layer 5. The stress relaxation layer 9 does not extend any of the gap 102 between each of the plurality of first electrode fingers 61 and the second busbar 82 and a gap 103 between each of the plurality of fourth electrode fingers 64 and the third busbar 83 in a plan view from the thickness direction D0 of the support substrate 2. The stress relaxation layer 9 is one piece between the plurality of second electrode fingers 62 and the plurality of third electrode fingers 63. In other words, only one stress relaxation layer 9 is provided on the first principal surface 51 of the piezoelectric layer 5 between the second connection section 72 and the piezoelectric layer 5, and is one continuous layer that is not divided into a plurality of portions on the first principal surface 51 of the piezoelectric layer 5.

The material of the stress relaxation layer 9 is, for example, silicon oxide or polyimide, but is not limited thereto, and may be, for example, hafnium oxide ($HfO_2$), niobium oxide ($Nb_2O_5$), tantalum oxide ($Ta_2O_5$), tungsten oxide ($WO_3$), or cerium oxide ($CeO_2$).

In a plan view from the thickness direction D0 of the support substrate 2, the stress relaxation layer 9 has a rectangular or substantially rectangular shape, for example, but is not limited thereto, and may have a square or substantially square shape, for example. The stress relaxation layer 9 intersects (here, is orthogonal to) the second connection section 72 in the plan view from the thickness direction D0 of the support substrate 2. The stress relaxation layer 9 includes a first projection 93 and a second projection 94. The first projection 93 projects from a first end 723 in a width direction D3 of the second connection section 72 in the plan view from the thickness direction D0 of the support substrate 2. In the acoustic wave device 1 according to Preferred Embodiment 1, the width direction D3 of the second connection section 72 is parallel or substantially parallel to the first direction D1 and the second direction D2, but is not limited thereto, and may be non-parallel to those directions. The second connection section 72 corresponds to a wiring width direction that defines a wiring width when a portion of the second connection section 72 excluding the second busbar 82 and the third busbar 83 is considered as wiring. The second projection 94 projects from a second end 724 in the width direction D3 of the second connection section 72 in the plan view from the thickness direction D0 of the support substrate 2.

In the acoustic wave device 1, in the plan view from the thickness direction D0 of the support substrate 2, a distance L13 (see FIG. 2) between an end 91 of the stress relaxation layer 9 on the plurality of second electrode fingers 62 side and the plurality of first electrode fingers 61 is longer than a distance L11 (see FIG. 2) between an end 72A1 of the first layer 72A of the second connection section 72 on the plurality of second electrode fingers 62 side and the plurality of first electrode fingers 61. In a case where there is a variation in length of the plurality of first electrode fingers 61, a distance between the end 91 of the stress relaxation layer 9 on the plurality of second electrode fingers 62 side and the longest first electrode finger 61 (the first electrode finger 61, the tip of which is closest to the second connection section 72) among the plurality of first electrode fingers 61 is taken as the distance L13.

In the acoustic wave device 1, in the plan view from the thickness direction D0 of the support substrate 2, a distance L23 (see FIG. 2) between an end 92 of the stress relaxation layer 9 on the plurality of third electrode fingers 63 side and the plurality of fourth electrode fingers 64 is longer than a distance L21 (see FIG. 2) between an end 72A2 of the first layer 72A of the second connection section 72 on the plurality of third electrode fingers 63 side and the plurality of fourth electrode fingers 64. In a case where there is a variation in length of the plurality of fourth electrode fingers 64, a distance between the end 92 of the stress relaxation layer 9 on the plurality of third electrode fingers 63 side and the longest fourth electrode finger 64 (the fourth electrode finger 64, the tip of which is closest to the second connection section 72) among the plurality of fourth electrode fingers 64 is taken as the distance L23.

In the acoustic wave device 1, in the plan view from the thickness direction D0 of the support substrate 2, the distance L13 (see FIG. 2) between the end 91 of the stress relaxation layer 9 on the plurality of second electrode fingers 62 side and the plurality of first electrode fingers 61 is longer than a distance L12 (see FIG. 2) between an end 72B1 of the second layer 72B on the plurality of second electrode fingers 62 side and the plurality of first electrode fingers 61.

Figure 2:
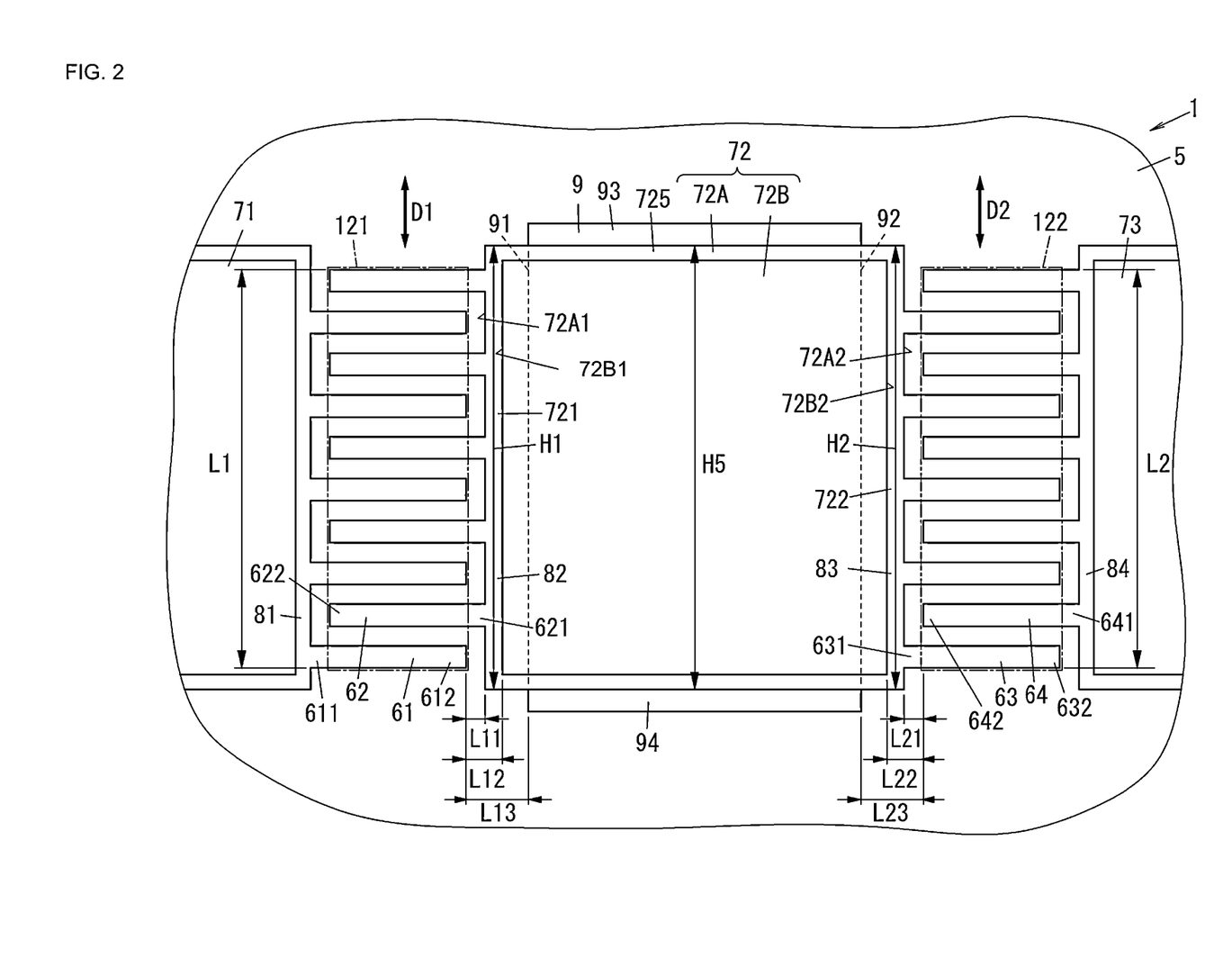
FIG. 2 is an explanatory diagram of dimensions of the acoustic wave device.

In the acoustic wave device 1, in the plan view from the thickness direction D0 of the support substrate 2, the distance L23 (see FIG. 2) between the end 92 of the stress relaxation layer 9 on the plurality of third electrode fingers 63 side and the plurality of fourth electrode fingers 64 is longer than a distance L22 (see FIG. 2) between an end 72B2 of the second layer 72B on the plurality of third electrode fingers 63 side and the plurality of fourth electrode fingers 64, as illustrated in FIG. 2.

(2.8) Low Acoustic Velocity Film

The low acoustic velocity film 4 is provided between the piezoelectric layer 5 and the support substrate 2. In the acoustic wave device 1 according to Preferred Embodiment 1, the low acoustic velocity film 4 is indirectly provided on the support substrate 2 with the high acoustic velocity film 3 interposed therebetween.

The low acoustic velocity film 4 is a film such that the acoustic velocity of a bulk wave propagating through the low acoustic velocity film 4 is lower than the acoustic velocity of a bulk wave propagating through the piezoelectric layer 5. In the support substrate 2, the acoustic velocity of a bulk wave propagating through the support substrate 2 is higher than the acoustic velocity of an acoustic wave propagating through the piezoelectric layer 5. In this case, the bulk wave propagating through the support substrate 2 is a bulk wave having the lowest acoustic velocity among a plurality of the bulk waves propagating through the support substrate 2.

In the acoustic wave device 1 according to Preferred Embodiment 1, the low acoustic velocity film 4 is provided between the high acoustic velocity film 3 and the piezoelectric layer 5. In the acoustic wave device 1, the low acoustic velocity film 4 is provided between the high acoustic velocity film 3 and the piezoelectric layer 5, which lowers the acoustic velocity of the acoustic wave. The acoustic wave has a property that energy is concentrated in a medium of low acoustic velocity. Accordingly, it is possible to improve the effect of confining the energy of the acoustic wave in each of the piezoelectric layer 5, and the first IDT electrode 111 and the second IDT electrode 112, where the acoustic wave is excited. As a result, the acoustic wave device 1 may reduce the loss and increase the Q value as compared with the case where the low acoustic velocity film 4 is not provided.

The material of the low acoustic velocity film 4 is, for example, silicon oxide. The material of the low acoustic velocity film 4 is not limited to silicon oxide. The material of the low acoustic velocity film 4 may be, for example, glass, silicon oxynitride, tantalum oxide, a compound obtained by adding fluorine, carbon or boron to silicon oxide, or a material containing any of the above materials as a main ingredient.

When the low acoustic velocity film 4 is made of silicon oxide, the acoustic wave device 1 may improve temperature characteristics. Lithium tantalate has negative temperature characteristics, while silicon oxide has positive temperature characteristics. Thus, in the acoustic wave device 1, the absolute value of the TCF may be decreased.

The thickness of the low acoustic velocity film 4 is preferably, for example, about $2.0\lambda$ or less, where $\lambda$ is a wavelength of the acoustic wave determined by the electrode finger pitch P1 described above. The low acoustic velocity film 4 is, for example, about 670 nm in thickness. By setting the thickness of the low acoustic velocity film 4 to be about $2.0\lambda$ or less, the film stress may be reduced. As a result, a warp in a wafer (for example, a silicon wafer) which is a base of the support substrate 2 may be reduced at the time of manufacturing the acoustic wave device 1, thereby making it possible to improve the non-defective rate and stabilize the characteristics.

(2.9) High Acoustic Velocity Film

The high acoustic velocity film 3 is provided between the support substrate 2 and the low acoustic velocity film 4. In this case, the high acoustic velocity film 3 is provided directly on the first principal surface 21 of the support substrate 2. The high acoustic velocity film 3 is a film such that the acoustic velocity of a bulk wave propagating through the high acoustic velocity film 3 is higher than the acoustic velocity of an acoustic wave propagating through the piezoelectric layer 5. The thickness of the high acoustic velocity film 3 is, for example, about 200 nm, about 300 nm, or about 400 nm.

The high acoustic velocity film 3 reduces or prevents the leakage of energy of the main mode acoustic wave to a structure below the high acoustic velocity film 3. In the acoustic wave device 1, when the high acoustic velocity film 3 is sufficiently thick, the energy of the main mode acoustic wave is distributed throughout the piezoelectric layer 5 and the low acoustic velocity film 4, is also distributed in part of the high acoustic velocity film 3 on the low acoustic velocity film 4 side, and is not distributed in the support substrate 2. The mechanism configured to confine the acoustic wave by the high acoustic velocity film 3 is the same as or similar to a mechanism in a case of a surface acoustic wave of a Love wave type, which is a non-leakage SH wave. The mechanism in the case of the Love wave-type surface acoustic wave is described, for example, in the document "Introduction to Simulation Technologies for Surface Acoustic Wave Device", Ken-ya Hashimoto, REALIZE Science & Engineering, pp. 26-28. This mechanism is different from a mechanism in which an acoustic wave is confined using a Bragg reflector by an acoustic multilayer film.

The material of the high acoustic velocity film 3 is, for example, silicon nitride. The material of the high acoustic velocity film 3 is not limited to silicon nitride, and may be, for example, at least one material selected from the group consisting of diamond-like carbon, aluminum nitride, aluminum oxide, silicon carbide, silicon, sapphire, a piezoelectric body (lithium tantalate, lithium niobate, or crystal), alumina, zirconia, cordierite, mullite, steatite, forsterite, magnesia, and diamond. The material of the high acoustic velocity film 3 may be a material containing any of the above-described materials as a main ingredient or a material containing, as a main ingredient, a mixture including any of the above-described materials.

(3) Manufacturing Method for Acoustic Wave Device

Hereinafter, a non-limiting example of a manufacturing method for the acoustic wave device 1 will be briefly described.

In the manufacturing method for the acoustic wave device 1, at least first to fifth steps described below are performed.

In the first step, a piezoelectricity substrate having a laminated structure including the support substrate 2, the high acoustic velocity film 3, the low acoustic velocity film 4, and the piezoelectric layer 5 is prepared.

In the second step, the stress relaxation layer 9 is formed on the first principal surface 51 of the piezoelectric layer 5 in the piezoelectricity substrate. When the material of the stress relaxation layer 9 is, for example, silicon oxide, the stress relaxation layer 9 is formed by using, for example, a film-formation technique, a photolithography technique, and an etching technique. When the material of the stress relaxation layer 9 is, for example, polyimide, in the second step, the stress relaxation layer 9 is formed by using, for example, the photolithography technique.

In the second step, a resist layer is formed on the first principal surface 51 of the piezoelectric layer 5 in the piezoelectricity substrate. In this case, in the second step, a first resist layer is formed that is patterned so as to expose, in the first principal surface 51 of the piezoelectric layer 5, formation-expected regions for the plurality of first electrode fingers 61, the plurality of second electrode fingers 62, the plurality of third electrode fingers 63, the plurality of fourth electrode fingers 64, the first layer 71A of the first connection section 71, the first layer 72A of the second connection section 72, and the first layer 73A of the third connection section 73.

In the third step, a laminated film to be a base including the plurality of first electrode finger 61, the plurality of second electrode fingers 62, the plurality of third electrode fingers 63, the plurality of fourth electrode fingers 64, the first layer 71A of the first connection section 71, the first layer 72A of the second connection section 72, and the first layer 73A of the third connection section 73 is formed on the piezoelectric layer 5 (on the exposed regions in the first principal surface 51 of the piezoelectric layer 5 and on the surface of the stress relaxation layer 9) by vapor deposition. The laminated film has a laminated structure including the first metal film (for example, a Ti film) and the second metal film (for example, an Al film) on the first metal film.

In the fourth step, the laminated film is patterned through removing the first resist layer and unnecessary films on the first resist layer by performing, for example, lift-off. As a result, in the fourth step, of the laminated film, portions corresponding to the plurality of first electrode fingers 61, the plurality of second electrode fingers 62, the plurality of third electrode fingers 63, the plurality of fourth electrode fingers 64, the first layer 71A of the first connection section 71, the first layer 72A of the second connection section 72, and the first layer 73A of the third connection section 73 are left on the piezoelectric layer 5. In this case, the unnecessary films are portions formed on the first resist layer in the laminated film having been formed in the third step.

In the fifth step, the second layer 71B of the first connection section 71, the second layer 72B of the second connection section 72, and the second layer 73B of the third connection section 73 are formed. The second layer 71B of the first connection section 71, the second layer 72B of the second connection section 72, and the second layer 73B of the third connection section 73 are formed utilizing a thin film-formation technique (for example, vapor deposition or sputtering), a photolithography technique, and an etching technique, but are not limited to utilizing these techniques, and may be formed utilizing a lift-off technique, for example.

In the manufacturing method for the acoustic wave device 1, after the fifth step, a wafer including a plurality of the acoustic wave devices 1 is cut with a dicing machine to produce a plurality of pieces of acoustic wave devices 1 (chips). The manufacturing method for the acoustic wave device 1 is an example and is not particularly limited.

(4) Summary

The acoustic wave device 1 according to Preferred Embodiment 1 includes the stress relaxation layer 9 provided between the second connection section 72 and the piezoelectric layer 5. In this case, the stress relaxation layer 9 does not extend to any of the gap 102 between each of the plurality of first electrode fingers 61 and the second busbar 82 and the gap 103 between each of the plurality of fourth electrode fingers 64 and the third busbar 83 in a plan view from the thickness direction D0 of the support substrate 2.

The acoustic wave device 1 according to Preferred Embodiment 1 may reduce or prevent the occurrence of polarization reversal. Whether the polarization reversal occurs in a region overlapping each of the gaps 102 and 103 in the piezoelectric layer 5 may be confirmed by observation using a scanning probe microscope, for example.

Figure 3A:
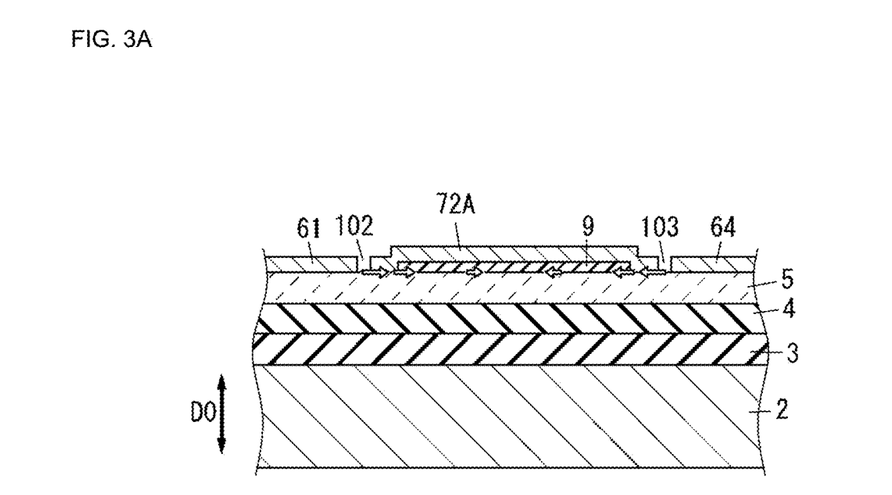
FIG. 3A is an explanatory diagram of stresses applied to a first principal surface of a piezoelectric layer.
Figure 3B:
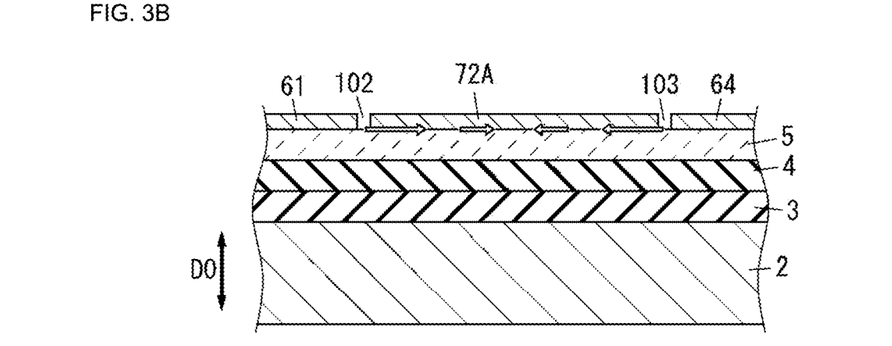
FIG. 3B is an explanatory diagram of stresses applied to a first principal surface of a piezoelectric layer in a case where a stress relaxation layer is not provided.

FIG. 3A is an explanatory diagram of stresses applied to the first principal surface 51 of the piezoelectric layer 5. FIG. 3B is an explanatory diagram of stresses applied to the first principal surface 51 of the piezoelectric layer 5 in a case where the stress relaxation layer 9 is not provided. FIGS. 3A and 3B are diagrams for explaining a presumed mechanism in which the stresses applied to the first principal surface 51 of the piezoelectric layer 5 are relaxed by the stress relaxation layer 9. In each of FIGS. 3A and 3B, arrows along the first principal surface 51 of the piezoelectric layer 5 represent directions of the stresses applied to the first principal surface 51, and the magnitude of the stresses is indicated by the lengths of the arrows. That is, the longer the arrow, the larger the stress is, and the shorter the arrow, the smaller the stress is. In a configuration in which the piezoelectric layer 5 and the support substrate 2 are directly or indirectly bonded to each other, stresses applied to regions overlapping the gaps 102 and 103 on the first principal surface 51 of the piezoelectric layer 5 due to a difference in linear expansion coefficient between the piezoelectric layer 5 and the first layer 72A of the second connection section 72 become larger in some cases affected by a difference in linear expansion coefficient between the piezoelectric layer 5 and the support substrate 2, as compared to the acoustic wave device having a configuration in which the piezoelectric layer 5 also serves as the support substrate. In the case where the stress relaxation layer 9 is provided, because the stress relaxation layer 9 absorbs the stress from the second connection section 72, it is possible to relax the stresses applied to the regions overlapping the gaps 102 and 103 on the first principal surface 51 of the piezoelectric layer 5, as compared to the case where the stress relaxation layer is not provided. In the configuration including the stress relaxation layer 9, the average value of the magnitude of the stresses applied to the regions overlapping the gaps 102 and 103 on the first principal surface 51 of the piezoelectric layer 5 may be reduced by about 20%, for example, compared to the configuration not including the stress relaxation layer 9.

Preferred Embodiment 2

Figure 4:
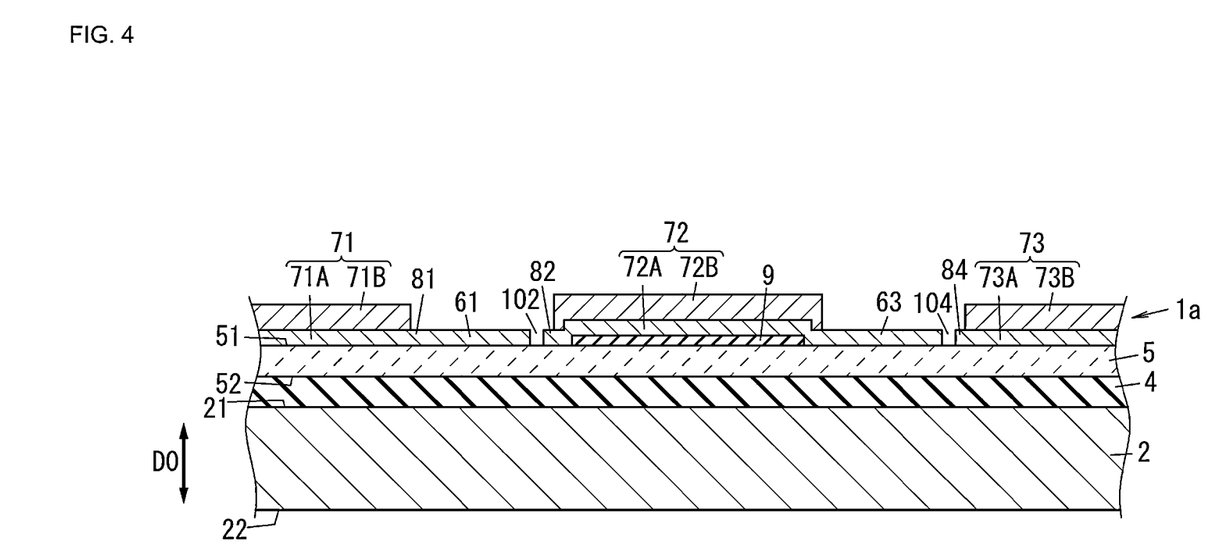
FIG. 4 is a cross-sectional view of an acoustic wave device according to Preferred Embodiment 2 of the present invention.

Next, an acoustic wave device 1*a* according to Preferred Embodiment 2 of the present invention will be described with reference to FIG. 4. As for the acoustic wave device 1*a* according to Preferred Embodiment 2, the same or corresponding elements as those of the acoustic wave device 1 according to Preferred Embodiment 1 are denoted by the same reference signs, and description thereof will be omitted.

The acoustic wave device 1*a* according to Preferred Embodiment 2 is different from the acoustic wave device 1 according to Preferred Embodiment 1 in that the high acoustic velocity film 3 of the acoustic wave device 1 according to Preferred Embodiment 1 is not provided. That is, in the acoustic wave device 1*a* according to Preferred Embodiment 2, a low acoustic velocity film 4 is provided directly on a first principal surface 21 of a support substrate 2.

The acoustic wave device 1*a* according to Preferred Embodiment 2 includes the same or substantially the same stress relaxation layer 9 as that of the acoustic wave device 1 according to Preferred Embodiment 1, which makes it possible to suppress the occurrence of polarization reversal.

Preferred Embodiment 3

Figure 5:
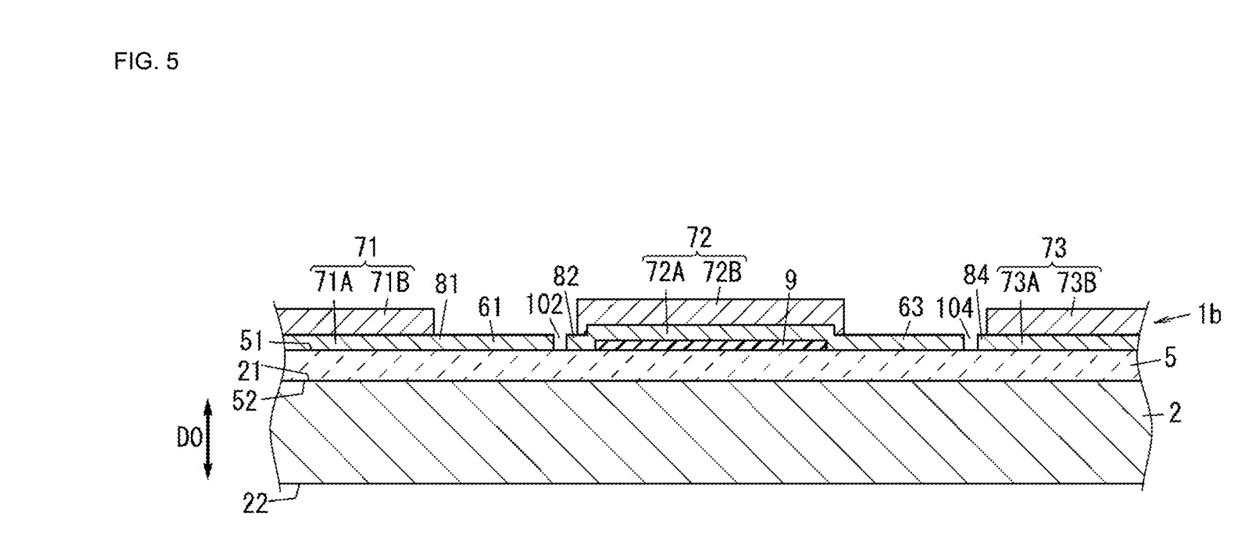
FIG. 5 is a cross-sectional view of an acoustic wave device according to Preferred Embodiment 3 of the present invention.

Next, an acoustic wave device 1*b* according to Preferred Embodiment 3 of the present invention will be described with reference to FIG. 5. As for the acoustic wave device 1*b* according to Preferred Embodiment 3, the same or corresponding elements as those of the acoustic wave device 1 according to Preferred Embodiment 1 are denoted by the same reference signs, and description thereof will be omitted.

The acoustic wave device 1*b* according to Preferred Embodiment 3 is different from the acoustic wave device 1 according to Preferred Embodiment 1 in that neither of the high acoustic velocity film 3 and the low acoustic velocity film 4 of the acoustic wave device 1 according to Preferred Embodiment 1 are provided. That is, in the acoustic wave device 1*b* according to Preferred Embodiment 3, a piezoelectric layer 5 is provided directly on a first principal surface 21 of a support substrate 2.

In the acoustic wave device 1*b* according to Preferred Embodiment 3, the support substrate 2 is a high acoustic velocity support substrate. The support substrate 2 includes, for example, at least one material selected from the group consisting of silicon, aluminum nitride, aluminum oxide, silicon carbide, silicon nitride, sapphire, lithium tantalate, lithium niobate, crystal, alumina, zirconia, cordierite, mullite, steatite, forsterite, magnesia, and diamond.

The acoustic wave device 1*b* according to Preferred Embodiment 3 includes the same or substantially the same stress relaxation layer 9 as that of the acoustic wave device 1 according to Preferred Embodiment 1, which makes it possible to suppress the occurrence of polarization reversal.

Preferred Embodiments 1 to 3 described above are merely examples of various preferred embodiments of the present invention. Preferred Embodiments 1 to 3 described above may be variously modified in accordance with design or the like as long as the advantageous effects of the present invention are achieved.

Each of the acoustic wave devices 1, 1*a*, and 1*b* may include a stress relaxation layer that is separate from the stress relaxation layer 9 and is interposed between the first connection section 71 and the piezoelectric layer 5. Each of the acoustic wave devices 1, 1*a*, and 1*b* may include a stress relaxation layer that is separate from the stress relaxation layer 9 and is interposed between the third connection section 73 and the piezoelectric layer 5.

The shape of the stress relaxation layer 9 in a plan view from the thickness direction D0 of the support substrate 2 may be appropriately modified in accordance with the shape of the second connection section 72 in the plan view from the thickness direction D0 of the support substrate 2.

In each of the acoustic wave devices 1, 1*a*, and 1*b*, the plurality of IDT electrodes 110 may be appropriately connected by a plurality of the connection sections (including the first connection section 71, the second connection section 72, and the third connection section 73) to define a ladder filter or a longitudinally coupled filter.

Each of the plurality of IDT electrodes 110 is a normal IDT electrode, but is not limited thereto, and may be an IDT electrode to which apodization weighting is applied or an inclined IDT electrode, for example. In the IDT electrode to which apodization weighting is applied, the overlap width increases from one end portion toward the center in the propagation direction of the acoustic wave, and decreases from the center toward the other end portion in the propagation direction of the acoustic wave.

The acoustic wave device 1 may further include a first reflector disposed on each of one side and the other side of the first IDT electrode 111 in the first direction D1, and a second reflector disposed on each of one side and the other side of the second IDT electrode 112 in the second direction D2. The first reflector reflects the acoustic wave whose acoustic wave propagation direction is the first direction D1. The second reflector reflects the acoustic wave whose acoustic wave propagation direction is the second direction D2.

The first and second reflectors are provided directly on the first principal surface 51 of the piezoelectric layer 5, for example. Each of the first reflector and the second reflector is, for example, a short-circuit grating, but is not limited thereto, and may be an open grating or a positive/negative reflection type grating, for example.

Each of the first reflector and the second reflector is electrically conductive. The material of the first and second reflectors is, for example, Al, Cu, Pt, Au, Ag, Ti, Ni, Cr, Mo, W, Ta, Mg, Fe, or an alloy mainly including any of these metals. Each of the first and second reflectors may have a structure in which a plurality of metal films made of these metals or alloys is laminated. Each of the first and second reflectors includes a laminated film including, for example, the first metal film made of a Ti film formed on the piezoelectric layer 5 and the second metal film made of an Al film formed on the first metal film.

The following preferred embodiments of the present invention are disclosed herein.

An acoustic wave device (1; 1a; 1b) according to a preferred embodiment of the present invention includes the support substrate (2), the piezoelectric layer (5), the plurality of first electrode fingers (61) and the plurality of second electrode fingers (62), the plurality of third electrode fingers (63) and the plurality of fourth electrode fingers (64), the first busbar (81), the connection section (the second connection section 72), and the fourth busbar (84). The plurality of first electrode fingers (61) and the plurality of second electrode fingers (62) are provided on the piezoelectric layer (5). The plurality of first electrode fingers (61) and the plurality of second electrode fingers (62) are spaced apart from each other in the first direction D1 intersecting the thickness direction (D0) of the support substrate (2). The plurality of third electrode fingers (63) and the plurality of fourth electrode fingers (64) are provided on the piezoelectric layer (5). The plurality of third electrode fingers (63) and the plurality of fourth electrode fingers (64) are spaced apart from each other in the second direction (D2) intersecting the thickness direction (D0) of the support substrate (2). The first busbar (81) is provided on the piezoelectric layer (5) and is connected to the one end (611) of each of the plurality of first electrode fingers (61). The connection section (the second connection section 72) includes the second busbar (82) and the third busbar (83). The second busbar (82) is provided on the piezoelectric layer (5) and is connected to the one end (621) of each of the plurality of second electrode fingers (62). The third busbar (83) is provided on the piezoelectric layer (5) and is connected to the one end (631) of each of the plurality of third electrode fingers (63). The fourth busbar (84) is provided on the piezoelectric layer (5) and is connected to the one end (641) of each of the plurality of fourth electrode fingers (64). The acoustic wave device (1; 1a; 1b) further includes the stress relaxation layer (9). The stress relaxation layer (9) is provided between the connection section (72) and the piezoelectric layer (5). The second busbar (82) faces the other end (612) of each of the plurality of first electrode fingers (61). The third busbar (83) faces the other end (642) of each of the plurality of fourth electrode fingers (64). The stress relaxation layer (9) does not extend to any of the gap (102) between each of the plurality of first electrode fingers (61) and the second busbar (82) and the gap (103) between each of the plurality of fourth electrode fingers (64) and the third busbar (83) in a plan view from the thickness direction (D0) of the support substrate (2).

The acoustic wave device (1; 1a; 1b) according to the above-described preferred embodiment may reduce or prevent the occurrence of polarization reversal.

In the above-described acoustic wave device (1; 1a; 1b), because the stress relaxation layer (9) does not extend to any of the gap (102) between each of the plurality of first electrode fingers (61) and the second busbar (82) and the gap (103) between each of the plurality of fourth electrode fingers (64) and the third busbar (83) in the plan view from the thickness direction (D0) of the support substrate (2), excitation characteristics of the acoustic wave device (1; 1a; 1b) are unlikely to be degraded.

In an acoustic wave device (1; 1a; 1b) according to a preferred embodiment of the present invention, the stress relaxation layer (9) includes the first projection (93) and the second projection (94). The first projection (93) projects from the first end 723 in the width direction (D3) of the connection section (the second connection section 72) in the plan view from the thickness direction (D0) of the support substrate (2). The second projection (94) projects from the second end (724) in the width direction (D3) of the connection section (the second connection section 72) in the plan view from the thickness direction (D0) of the support substrate (2).

In the above-described acoustic wave device (1; 1a; 1b), a margin may be obtained for the variation in the position of the stress relaxation layer (9) in the width direction (D3) of the connection section (the second connection section 72).

In an acoustic wave device (1; 1a; 1b) according to a preferred embodiment of the present invention, the connection section (the second connection section 72) includes the first connection end portion (721) including the second busbar (82) and the second connection end portion (722) including the third busbar (83). In the connection section (the second connection section 72), the width (H1) of the first connection end portion (721) in the first direction (D1) is equal to or larger than the first length (L1), which is a length in the first direction (D1) of the overlap region (121) of the plurality of first electrode fingers (61) and the plurality of second electrode fingers (62). In the connection section (the second connection section 72), the width (H2) of the second connection end portion (722) in the second direction (D2) is equal to or larger than the second length (L2), which is a length in the second direction (D2) of the overlap region (122) of the plurality of third electrode fingers (63) and the plurality of fourth electrode fingers (64).

In the above-described acoustic wave device (1; 1a; 1b), the resistance of the connection section (the second connection section 72) may be lowered, and the loss may be reduced.

In an acoustic wave device (1; 1a; 1b) according to a preferred embodiment of the present invention, in the connection section (the second connection section 72), the width (H5) in the portion (725) between the first connection end portion (721) and the second connection end portion (722) is not smaller than any of the first length (L1) and the second length (L2).

In the above-described acoustic wave device (1; 1a; 1b), the resistance of the connection section (the second connection section 72) may be further lowered, and the loss may be reduced.

In an acoustic wave device (1; 1a; 1b) according to a preferred embodiment of the present invention, the stress relaxation layer (9) is one piece between the plurality of second electrode fingers (62) and the plurality of third electrode fingers (63).

In the above-described acoustic wave device (1; 1a; 1b), stresses applied to regions overlapping the gaps (102 and 103) in the piezoelectric layer (5) may be further relaxed.

In an acoustic wave device (1; 1a; 1b) according to a preferred embodiment of the present invention, the connection section (the second connection section 72) is integrally provided with the plurality of second electrode fingers (62) and the plurality of third electrode fingers (63).

In the above-described acoustic wave device (1; 1a; 1b) preferred embodiment of the present invention, it is possible to reduce or prevent the degradation in characteristics as compared with a case where there is a contact interface between the connection section (the second connection section 72), and the plurality of second electrode fingers (62) and the plurality of third electrode fingers (63).

In an acoustic wave device (1; 1a; 1b) according to a preferred embodiment of the present invention, the connection section (the second connection section 72) includes the first layer (72A) and the second layer (72B). The first layer (72A) is integrally provided with the plurality of second electrode fingers (62) and the plurality of third electrode fingers (63). The second layer (72B) is formed on the opposite side of the first layer 72A to the piezoelectric layer (5).

In the above-described acoustic wave device (1; 1a; 1b), the resistance of the connection section (the second connection section 72) may be lowered, and the loss may be reduced.

In an acoustic wave device (1; 1a; 1b) according to a preferred embodiment of the present invention, the distance (L13) between the end (91) of the stress relaxation layer (9) on the plurality of second electrode fingers (62) side and the plurality of first electrode fingers (61) is longer than the distance (L11) between the end (72A1) of the first layer (72A) on the plurality of second electrode fingers (62) side and the plurality of first electrode fingers (61) in a plan view from the thickness direction (D0) of the support substrate (2). In the plan view from the thickness direction (D0) of the support substrate (2), the distance (L23) between the end (92) of the stress relaxation layer (9) on the plurality of third electrode fingers (63) side and the plurality of fourth electrode fingers (64) is longer than the distance (L21) between the end (72A2) of the first layer (72A) on the plurality of third electrode fingers (63) side and the plurality of fourth electrode fingers (64).

In the above-described acoustic wave device (1; 1a; 1b), a larger margin may be obtained for the variation in the position of the stress relaxation layer (9).

In an acoustic wave device (1; 1a; 1b) according to a preferred embodiment of the present invention, the distance (L13) between the end (91) of the stress relaxation layer (9) on the plurality of second electrode fingers (62) side and the plurality of first electrode fingers (61) is longer than the distance (L12) between the end (72B1) of the second layer (72B) on the plurality of second electrode fingers (62) side and the plurality of first electrode fingers (61) in a plan view from the thickness direction (D0) of the support substrate (2). In the plan view from the thickness direction (D0) of the support substrate (2), the distance (L23) between the end (92) of the stress relaxation layer (9) on the plurality of third electrode fingers (63) side and the plurality of fourth electrode fingers (64) is longer than the distance (L22) between the end (72B2) of the second layer (72B) on the plurality of third electrode fingers (63) side and the plurality of fourth electrode fingers (64).

In the above-described acoustic wave device (1; 1a; 1b), a larger margin may be obtained for the variation in the position of the stress relaxation layer (9).

In an acoustic wave device (1; 1a) according to a preferred embodiment of the present invention, the connection section (the second connection section 72) does not include a pad electrode.

In the above-described acoustic wave device (1; 1a), the effect of a stress applied to a pad electrode via a bump connected to the pad electrode may be reduced or prevented.

An acoustic wave device (1; 1a) according to a preferred embodiment of the present invention further includes the low acoustic velocity film (4). The low acoustic velocity film (4) is provided between the support substrate (2) and the piezoelectric layer (5). The piezoelectric layer (5) includes at least one material selected from the group consisting of lithium tantalate, lithium niobate, zinc oxide, aluminum nitride, and PZT. The low acoustic velocity film (4) includes at least one material selected from the group consisting of silicon oxide, glass, silicon oxynitride, tantalum oxide, and a compound obtained by adding fluorine, carbon, or boron to silicon oxide.

The above-described acoustic wave device (1; 1a) may reduce the loss and increase the Q value as compared with a case where the low acoustic velocity film (4) is not provided.

An acoustic wave device (1) according to a preferred embodiment of the present invention further includes the low acoustic velocity film (4) and the high acoustic velocity film (3). The low acoustic velocity film (4) is provided between the support substrate (2) and the piezoelectric layer (5). The high acoustic velocity film (3) is provided between the support substrate (2) and the low acoustic velocity film (4). The piezoelectric layer (5) includes at least one material selected from the group consisting of lithium tantalate, lithium niobate, zinc oxide, aluminum nitride, and PZT. The low acoustic velocity film (4) includes at least one material selected from the group consisting of silicon oxide, glass, silicon oxynitride, tantalum oxide, and a compound obtained by adding fluorine, carbon, or boron to silicon oxide. The high acoustic velocity film (3) includes at least one material selected from the group consisting of diamond-like carbon, aluminum nitride, aluminum oxide, silicon carbide, silicon nitride, silicon, sapphire, lithium tantalate, lithium niobate, crystal, alumina, zirconia, cordierite, mullite, steatite, forsterite, magnesia, and diamond.

In the above-described acoustic wave device (1), it is possible to reduce or prevent the leakage of the acoustic wave to the support substrate (2) and increase the Q value.

In an acoustic wave device (1b) according to a preferred embodiment of the present invention, the piezoelectric layer (5) includes at least one material selected from the group consisting of lithium tantalate, lithium niobate, zinc oxide, aluminum nitride, and PZT. The support substrate (2) includes at least one material selected from the group consisting of silicon, aluminum nitride, aluminum oxide, silicon carbide, silicon nitride, sapphire, lithium tantalate, lithium niobate, crystal, alumina, zirconia, cordierite, mullite, steatite, forsterite, magnesia, and diamond.

In the above-described acoustic wave device (1b), it is possible to reduce or prevent the leakage of the acoustic wave to the support substrate (2) and increase the Q value.

In an acoustic wave device (1; 1a; 1b) according to a preferred embodiment of the present invention, the stress relaxation layer (9) includes at least one material selected from the group consisting of silicon oxide, polyimide, hafnium oxide, niobium oxide, tantalum oxide, tungsten oxide, and cerium oxide.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An acoustic wave device, comprising:
a support substrate;
a piezoelectric layer on the support substrate;
a plurality of first electrode fingers and a plurality of second electrode fingers on the piezoelectric layer and spaced apart from each other in a first direction intersecting a thickness direction of the support substrate;
a plurality of third electrode fingers and a plurality of fourth electrode fingers on the piezoelectric layer and spaced apart from each other in a second direction intersecting the thickness direction of the support substrate;

a first busbar on the piezoelectric layer and connected to one end of each of the plurality of first electrode fingers;
a connection section including a second busbar on the piezoelectric layer and connected to one end of each of the plurality of second electrode fingers, and a third busbar on the piezoelectric layer and connected to one end of each of the plurality of third electrode fingers;
a fourth busbar on the piezoelectric layer and connected to one end of each of the plurality of fourth electrode fingers; and
a stress relaxation layer between the connection section and the piezoelectric layer; wherein
the second busbar faces another end of each of the plurality of first electrode fingers;
the third busbar faces another end of each of the plurality of fourth electrode fingers; and
the stress relaxation layer does not extend to either of a gap between the plurality of first electrode fingers and the second busbar or a gap between the plurality of fourth electrode fingers and the third busbar in a plan view from the thickness direction of the support substrate.

2. The acoustic wave device according to claim 1, wherein the stress relaxation layer includes:
a first projection projecting from a first end in a width direction of the connection section in the plan view from the thickness direction of the support substrate; and
a second projection projecting from a second end in the width direction of the connection section in the plan view from the thickness direction of the support substrate.

3. The acoustic wave device according to claim 1, wherein the connection section includes a first connection end portion including the second busbar, and a second connection end portion including the third busbar; and
in the connection section, a width of the first connection end portion in the first direction is equal to or larger than a first length, which is a length in the first direction of an overlap region of the plurality of first electrode fingers and the plurality of second electrode fingers, and a width of the second connection end portion in the second direction is equal to or larger than a second length, which is a length in the second direction of an overlap region of the plurality of third electrode fingers and the plurality of fourth electrode fingers.

4. The acoustic wave device according to claim 3, wherein a width in a portion between the first connection end portion and the second connection end portion is not smaller than either of the first length or the second length.

5. The acoustic wave device according to claim 1, wherein the stress relaxation layer is a single piece between the plurality of second electrode fingers and the plurality of third electrode fingers.

6. The acoustic wave device according to claim 1, wherein the connection section is integrally provided with the plurality of second electrode fingers and the plurality of third electrode fingers.

7. The acoustic wave device according to claim 1, wherein the connection section includes a first layer integrally provided with the plurality of second electrode fingers and the plurality of third electrode fingers, and a second layer on an opposite side of the first layer to the piezoelectric layer.

8. The acoustic wave device according to claim 7, wherein in a plan view from the thickness direction of the support substrate, a distance between an end of the stress relaxation layer on the plurality of second electrode fingers side and the plurality of first electrode fingers is longer than a distance between an end of the first layer on the plurality of second electrode fingers side and the plurality of first electrode fingers, and a distance between an end of the stress relaxation layer on the plurality of third electrode fingers side and the plurality of fourth electrode fingers is longer than a distance between an end of the first layer on the plurality of third electrode fingers side and the plurality of fourth electrode fingers.

9. The acoustic wave device according to claim 7, wherein in the plan view from the thickness direction of the support substrate, a distance between an end of the stress relaxation layer on the plurality of second electrode fingers side and the plurality of first electrode fingers is longer than a distance between an end of the second layer on the plurality of second electrode fingers side and the plurality of first electrode fingers, and a distance between an end of the stress relaxation layer on the plurality of third electrode fingers side and the plurality of fourth electrode fingers is longer than a distance between an end of the second layer on the plurality of third electrode fingers side and the plurality of fourth electrode fingers.

10. The acoustic wave device according to claim 1, wherein the connection section does not include a pad electrode.

11. The acoustic wave device according to claim 1, further comprising:
a low acoustic velocity film between the support substrate and the piezoelectric layer;
the piezoelectric layer includes at least one of lithium tantalate, lithium niobate, zinc oxide, aluminum nitride, and PZT; and
the low acoustic velocity film includes at least one of silicon oxide, glass, silicon oxynitride, tantalum oxide, and a compound obtained by adding fluorine, carbon, or boron to silicon oxide.

12. The acoustic wave device according to claim 11, wherein the stress relaxation layer includes at least one of silicon oxide, polyimide, hafnium oxide, niobium oxide, tantalum oxide, tungsten oxide, and cerium oxide.

13. The acoustic wave device according to claim 11, wherein a thickness of the low acoustic velocity film is about 670 nm.

14. The acoustic wave device according to claim 1, further comprising:
a low acoustic velocity film between the support substrate and the piezoelectric layer; and
a high acoustic velocity film between the support substrate and the low acoustic velocity film; wherein
the piezoelectric layer includes at least one of lithium tantalate, lithium niobate, zinc oxide, aluminum nitride, and PZT;
the low acoustic velocity film includes at least one of silicon oxide, glass, silicon oxynitride, tantalum oxide, and a compound obtained by adding fluorine, carbon, or boron to silicon oxide; and
the high acoustic velocity film includes at least one of diamond-like carbon, aluminum nitride, aluminum oxide, silicon carbide, silicon nitride, silicon, sapphire, lithium tantalate, lithium niobate, crystal, alumina, zirconia, cordierite, mullite, steatite, forsterite, magnesia, and diamond.

15. The acoustic wave device according to claim 14, wherein a thickness of the low acoustic velocity film is about 670 nm.

16. The acoustic wave device according to claim 14, wherein a thickness of the high acoustic velocity film is about 200 nm, about 300 nm, or about 400 nm.

17. The acoustic wave device according to claim 1, wherein
the piezoelectric layer includes at least one of lithium tantalate, lithium niobate, zinc oxide, aluminum nitride, and PZT; and
the support substrate includes at least one of silicon, aluminum nitride, aluminum oxide, silicon carbide, silicon nitride, sapphire, lithium tantalate, lithium niobate, crystal, alumina, zirconia, cordierite, mullite, steatite, forsterite, magnesia, and diamond.

18. The acoustic wave device according to claim 1, wherein the stress relaxation layer has a rectangular or substantially rectangular shape.

\* \* \* \* \*